(12) United States Patent
Fujii

(10) Patent No.: US 8,853,005 B2
(45) Date of Patent: Oct. 7, 2014

(54) METHOD FOR MANUFACTURING SEMICONDUCTOR DEVICE

(75) Inventor: Seiya Fujii, Chuo-ku (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 316 days.

(21) Appl. No.: 13/227,518

(22) Filed: Sep. 8, 2011

(65) Prior Publication Data

US 2012/0058605 A1    Mar. 8, 2012

(30) Foreign Application Priority Data

Sep. 8, 2010   (JP) ................................. 2010-201023

(51) Int. Cl.
 *H01L 21/00* (2006.01)
 *H01L 21/30* (2006.01)
 *H01L 21/44* (2006.01)
 *H01L 21/768* (2006.01)
 *H01L 23/48* (2006.01)

(52) U.S. Cl.
 CPC . *H01L 21/76898* (2013.01); *H01L 2224/14181* (2013.01); *H01L 2224/13009* (2013.01); *H01L 23/481* (2013.01); *H01L 2225/06541* (2013.01); *H01L 2224/05* (2013.01); *H01L 2224/13* (2013.01); *H01L 2224/11* (2013.01)
 USPC ............ 438/118; 438/458; 438/459; 438/667

(58) Field of Classification Search
 None
 See application file for complete search history.

(56) References Cited

U.S. PATENT DOCUMENTS

| | | | |
|---|---|---|---|
| 6,013,534 A * | 1/2000 | Mountain | 438/15 |
| 7,498,259 B2 * | 3/2009 | Yamano et al. | 438/667 |
| 7,579,663 B2 * | 8/2009 | Wan | 257/415 |
| 7,967,915 B2 * | 6/2011 | Sauar et al. | 134/7 |
| 8,053,280 B2 * | 11/2011 | Chiang et al. | 438/114 |
| 8,119,453 B2 * | 2/2012 | Hashimoto | 438/113 |
| 2006/0252262 A1 | 11/2006 | Kazemi | |
| 2008/0217784 A1 * | 9/2008 | Binder et al. | 257/762 |
| 2008/0224249 A1 * | 9/2008 | Nabe et al. | 257/433 |
| 2009/0134512 A1 * | 5/2009 | Chiang et al. | 257/723 |

FOREIGN PATENT DOCUMENTS

| | | | |
|---|---|---|---|
| JP | 06-244073 A | | 9/1994 |
| JP | 2002-083936 A | | 3/2002 |
| JP | 2004-296585 A | | 10/2004 |
| JP | 2005-136098 A | | 5/2005 |
| JP | 2006-229218 A | | 8/2006 |
| JP | 2007-05596 A | | 1/2007 |
| JP | 2007-242714 A | | 9/2007 |
| JP | 2007-311385 A | | 11/2007 |
| JP | 2009-111061 A | | 5/2009 |
| JP | 2011-243837 A | | 1/2011 |
| JP | 2013008915 | * | 1/2013 |
| WO | 2009/142078 A1 | | 11/2009 |

* cited by examiner

*Primary Examiner* — Charles Garber
*Assistant Examiner* — Ron Pompey
(74) *Attorney, Agent, or Firm* — Sughrue Mion, PLLC

(57) ABSTRACT

When forming a conductive film by a method comprising sputtering after grinding the back surface of a semiconductor substrate, in order to avoid discharge from a part of an adhesive flown out at the outer periphery of the substrate, wherein the adhesive is used to fix the substrate to a support during grinding, at least the substrate end or the adhesive is removed after grinding the semiconductor substrate and before forming the conductive film, so that a gap between the substrate end and the adhesive may have a predetermined size.

20 Claims, 10 Drawing Sheets

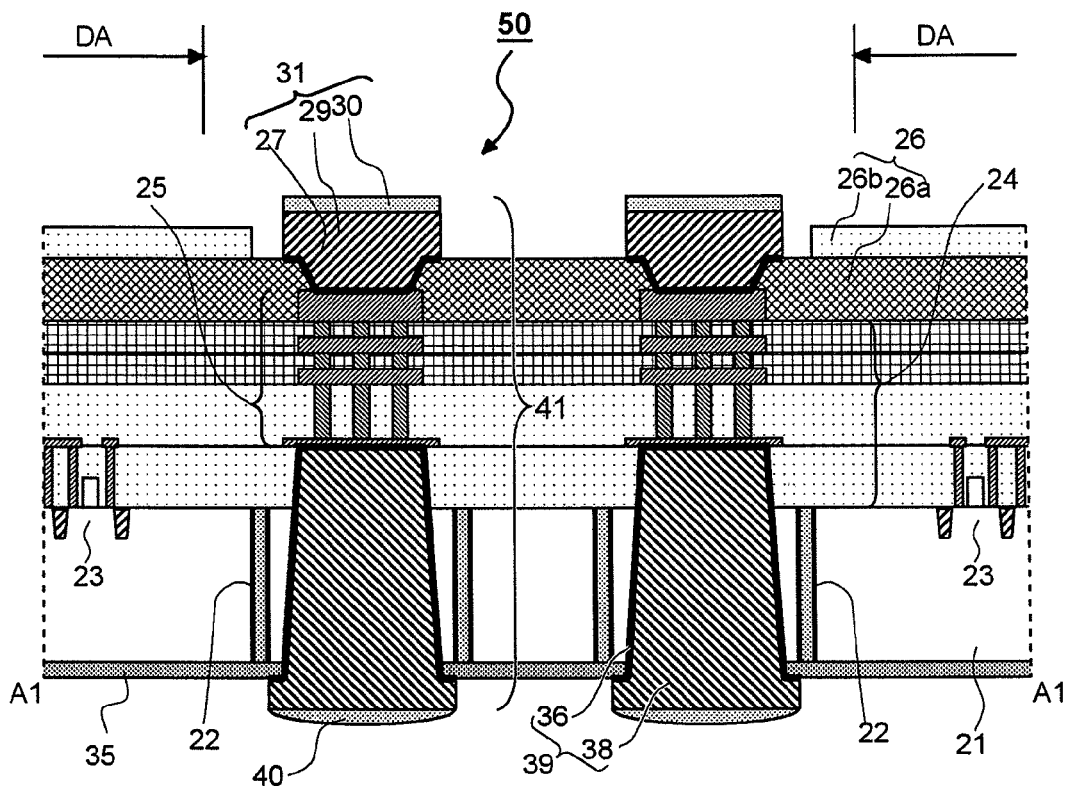
FIG. 15A
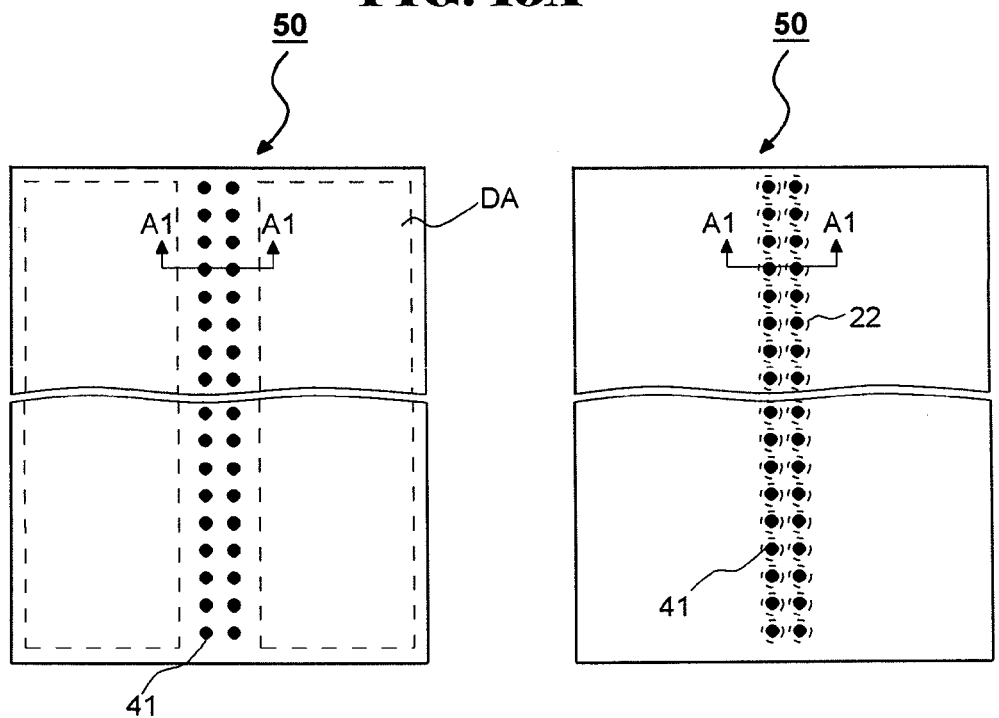
FIG. 15B     FIG. 15C

METHOD FOR MANUFACTURING SEMICONDUCTOR DEVICE

BACKGROUND OF THE INVENTION

1. Field of the Invention

The present invention relates to a method for manufacturing a semiconductor device. Specifically, the present invention relates to a method for manufacturing a semiconductor device after grinding the back surface of the semiconductor substrate when forming a through-substrate (-silicon) via (hereinafter referred to as "TSV") penetrating the semiconductor substrate. Also, the present invention relates to a method for manufacturing a semiconductor device comprising a TSV.

2. Description of the Related Art

In order to meet demands for miniaturizing semiconductor devices, technology wherein a plurality of semiconductor chips is stacked and TSVs are provided to connect the semiconductor chips has been developed. There is a method for forming a TSV comprising: forming a deep hole on the main surface where semiconductor elements are formed; filling a conductive film in the hole; and exposing the conductive film by grinding the back surface of the semiconductor film. Another method comprises: grinding the back surface of a semiconductor substrate, on the main surface of which semiconductor elements are formed; forming a through hole; and filling a conductor into the through hole. The latter method allows the thickness of a semiconductor substrate to become between 10 and 100 μm, thereby easily processing the semiconductor substrate. Also, it allows a semiconductor chip to become thinner, thereby miniaturizing the semiconductor device when stacking semiconductor chips.

When making the back surface of a semiconductor substrate, on the main surface of which semiconductor elements are formed, thinner by grinding it, in order to protect the semiconductor elements on the main surface or to prevent the semiconductor substrate from being broken, it is general to fix a support (support substrate), such as quartz, etc., onto the main surface of the semiconductor substrate by use of an adhesive (JP 2007-311385A).

When forming a TSV on the main surface of a semiconductor substrate, on which semiconductor elements are formed, in order to connect a terminal, etc. for easier external connection to the TSV, a wiring layer or a conductive pad is formed after grinding the back surface. Also, when forming a TSV on the back surface, the TSV is formed after grinding the back surface, and a wiring layer or a conductive pad may be formed on the back surface. Such conductive films are formed while fixing a support to hold the main surface of the semiconductor substrate. Along with the adhesive, the support is removed from the semiconductor substrate after forming the conductive films.

The inventor of the present invention discovered that a process for manufacturing a conductive film including a TSV after grinding the back surface of a semiconductor substrate, to which a support is fixed, has the following problems.

FIGS. 10 to 13 are prepared by the present inventor in order to explain the problems of the conventional process for manufacturing a conductive film.

FIG. 10 is a sectional view of a semiconductor substrate (wafer) to which a support is fixed, and FIG. 11 is a plane view thereof. As shown in FIGS. 10 and 11, semiconductor substrate 1, such as silicone (Si), etc., is fixed to support 2, such as quartz, etc., by use of adhesive 3, such as a photocurable resin, etc. Both semiconductor substrate 1 and support 2 are circular substrates in plane. Support 2 has a diameter slightly greater than that of semiconductor substrate 1.

Semiconductor substrate 1 is fixed in the direction where a main surface S, on which a circuit layer comprising a plurality of semiconductor elements, i.e., transistor, etc., is formed, faces support 2. In other words, as shown in FIG. 10, semiconductor substrate 1 is fixed such that the back surface thereof is upward. When fixing semiconductor substrate 1 to support 2, adhesive 3 applied in the liquid state is flown out from the side of semiconductor substrate 1. Thus, as shown in FIG. 10, the side of semiconductor substrate 1 is also covered with adhesive 3.

After curing adhesive 3, the back surface (upper surface in FIG. 10) of semiconductor substrate 1 is ground (background), so that semiconductor substrate 1 is adjusted to have a predetermined thickness. FIG. 12 is an enlarged view of the end (portion indicated by broken lines in FIG. 10) of semiconductor substrate 1 after performing such processes.

The adhesive contracts due to mechanical stress caused by the grinding of semiconductor substrate 1, slight bending of support 2, or heat generated by plasma etching, etc. after the grinding of semiconductor substrate 1. As a result, gap $d_0$ of several μm is made between semiconductor substrate 1 and adhesive 3. Gap $d_0$ may be made in the entire or a part of the outer periphery of semiconductor substrate 1.

When gap $d_0$ is made as shown in FIG. 12, if the TSV is processed (forming a conductive film) by use of a sputtering device, the surface of adhesive 3, which is an insulator, is charged-up and, thus, the local electric potential is likely to be increased. Local electric potential is not likely to be increased in the semiconductor substrate, because semiconductor substrate 1 is a silicon layer and charge is quickly moved over the entire of semiconductor substrate 1. Therefore, when the surface of adhesive 3 has electric potential greater than predetermined electric potential, thus over potential is discharged to semiconductor substrate 1, as shown in FIG. 13. Generally, before forming a conductive film and after grinding the back surface, an insulating film is formed. However, even though such insulating film is provided, thus discharge phenomenon takes place if the insulating film is thinner at sub-micron order. Since a large current instantaneously flows along with discharge, a current path on the semiconductor substrate is damaged (the substrate is hollowed-out). As a result, it is not possible to successfully process semiconductor layers, such as a TSV, etc.

As mentioned above, the conventional manufacturing method has a problem that the production yield of semiconductor devices is likely to be reduced due to discharge.

SUMMARY

The present inventor has discovered that when a gap between the end of a semiconductor substrate and an adhesive is enlarged to be greater than a predetermined size after grinding the back surface of the semiconductor substrate and before forming a conductive film, it is possible to avoid discharge caused by charge-up when forming the conductive film.

In other words, one embodiment of the present invention provides a method for manufacturing a semiconductor device including: fixing a semiconductor substrate to a support having an external diameter greater than that of the semiconductor substrate by use of an adhesive; and forming a conductive film on the semiconductor substrate by a method comprising at least sputtering after fixing the semiconductor substrate to the support; wherein before forming the conductive film, a gap between the semiconductor substrate and the adhesive flown out from the outer periphery of the semiconductor substrate is enlarged to a predetermined size by removing at least one of the semiconductor substrate and the adhesive.

Another embodiment of the present invention provides a method for manufacturing a semiconductor device including: fixing a semiconductor substrate to a support on a main surface of the semiconductor substrate by use of an adhesive, a main surface of the semiconductor substrate comprising a circuit layer having a plurality of semiconductor elements, the support having an external diameter greater than that of the semiconductor substrate; reducing the thickness of the semiconductor substrate by grinding the back surface of the semiconductor substrate; forming a conductive film on the back surface of the semiconductor substrate by a method comprising at least sputtering, after fixing the semiconductor substrate to the support; and separating the semiconductor substrate, on the back surface of which the conductive film is formed, from the adhesive and the support, wherein after reducing the thickness of the semiconductor substrate and before forming the conductive film, a gap between the semiconductor substrate and the adhesive flown out from the outer periphery of the semiconductor substrate is enlarged to a predetermined size.

Still another embodiment of the present invention provides a method for manufacturing a semiconductor device, the semiconductor device comprising a circuit layer having a plurality of semiconductor elements on the main surface of a semiconductor substrate and a through-substrate via (TSV) penetrating from the main surface to the back surface facing the main surface, the method including: fixing the semiconductor substrate, on which the circuit layer is formed, to a support having an external diameter greater than that of the substrate on the main surface by use of an adhesive; reducing the thickness of the semiconductor substrate by grinding the back surface of the semiconductor substrate; forming a through hole penetrating the semiconductor substrate from the back surface to the main surface; forming a TSV by filling a conductive film in the through hole; and separating the semiconductor substrate, on which the conductive film is formed, the adhesive, and the support, wherein forming the TSV comprises forming a seed layer covering the interior of the through hole by sputtering, and thereafter forming a conductive film in the through hole by electroplating the seed layer as an electrode; and wherein after reducing the thickness of the semiconductor substrate and before forming the seed layer, a gap between the semiconductor substrate and the adhesive flown out from the outer periphery of the semiconductor substrate is enlarged to a predetermined size.

It is possible to avoid discharge in a sputtering device when forming a conductive film, such as a TSV, etc. As a result, it is possible to manufacture a conductive film, such as a TSV, etc. without reducing production yield.

BRIEF DESCRIPTION OF THE DRAWINGS

The above features and advantages of the present invention will be more apparent from the following description of certain preferred embodiments taken in conjunction with the accompanying drawings, in which:

FIG. 15A is a schematic sectional view of one example of the semiconductor device according to one embodiment of the present invention, FIG. 15B is a plane view of one example of the semiconductor device according to one embodiment of the present invention when seeing the semiconductor device from the main surface, and FIG. 15C is a plane view of one example of the semiconductor device according to one embodiment of the present invention when seeing the semiconductor device from the back surface.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First Exemplary Embodiment

Like in the related art (see FIG. 10), a semiconductor substrate (wafer), such as silicon, etc., on the main surface of which a semiconductor element, such as a transistor, etc., is formed, is fixed to a support. A circular substrate (for example, a circular substrate having a diameter of 300 mm), such as quartz, an acrylic resin, etc., may be used as the support.

Semiconductor substrate 1 is prepared to have a diameter slightly smaller than that of support 2 (for example, the diameter smaller by 1-2 mm) and is fixed to support 2 by use of an adhesive 3.

A photocurable resin, a thermosetting resin, etc. may be used as adhesive 3.

After curing (solidifying) adhesive 3, a grinding the back surface (upper surface in FIG. 10) of semiconductor substrate 1, i.e., a back-grinding, is performed so as to reduce the thickness of semiconductor substrate 1 to a predetermined thickness (for example, 50 μm).

After back-grinding, the back surface may be continuously polished to obtain the smoother back surface. When the polishing is carried out, the semiconductor substrate should be adjusted to have the predetermined thickness after the polishing.

Thereafter, like in the related art (see FIG. 12), gap $d_0$ is generated between adhesive 3 and semiconductor substrate 1. Polishing may generate gap $d_0$.

Upon investigation of the relationship between discharge and the size of gap $d_0$, the present inventor has discovered that discharge is likely to occur when gap $d_0$ is less than 6 μm. Discharge was not found around a portion ($d_0$=0 μm) where semiconductor substrate 1 and adhesive 3 contact. It has been discovered that as gap $d_0$ becomes smaller, discharge frequently occurs, and if gap $d_0$ is 6 μm or greater, discharge was not found.

Figure 14:
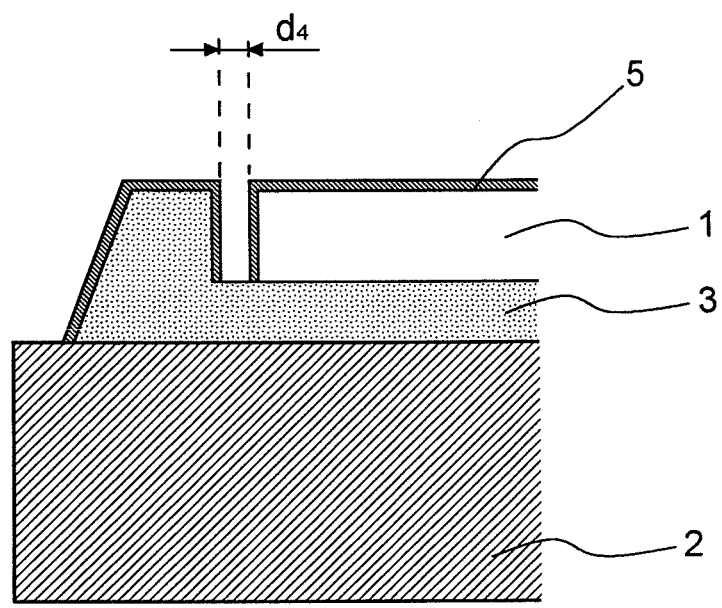
FIG. 14 is a mimetic sectional view showing the initial stage for forming a conductive film.

Also, if a conductive film is formed by sputtering, in the initial stage, the thickness of conductive film 5 gradually increases from both the side of semiconductor substrate 1 and the side of adhesive 3, as shown in FIG. 14. Therefore, since gap $d_4$ is gradually narrowed as thick as the thickness of the conductive film decreases, it is necessary to consider the thickness of the conductive film when discharge occurs. If the conductive films in the side of semiconductor substrate 1 and the side of adhesive 3 conduct electricity by forming the conductive films in the bottom of gap $d_4$, discharge was not found.

Based on the foregoing investigation, the embodiments of the present invention can avoid discharge by the method explained below.

Figure 1:
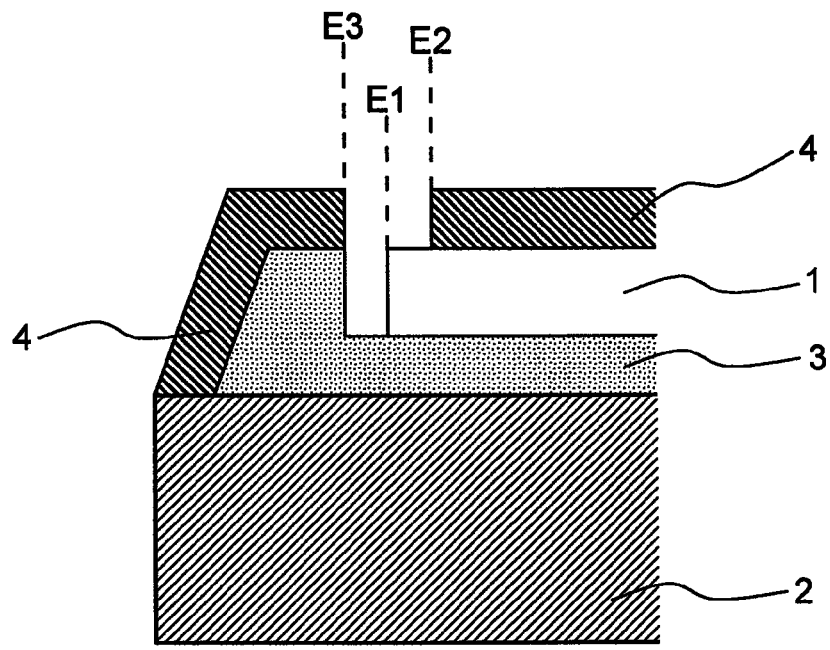
FIG. 1 is a mimetic sectional view of one end of a semiconductor substrate that explains the processes in the first embodiment.
Figure 2:
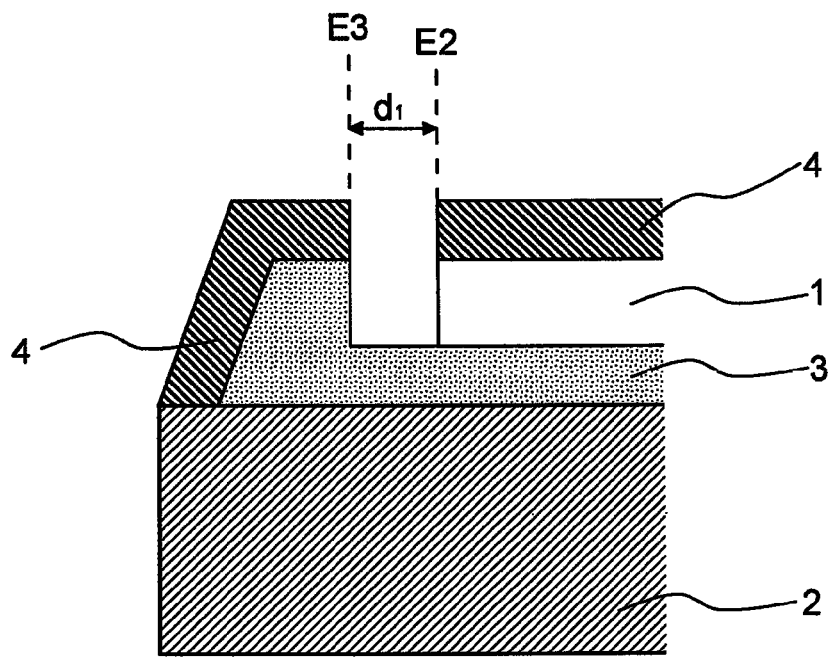
FIG. 2 is a mimetic sectional view of one end of a semiconductor substrate after performing the first embodiment.

FIGS. 1 and 2 are mimetic sectional views of one end (portion indicated by broken lines in FIG. 10) of semiconductor substrate 1.

(FIG. 1)

Photoresist film 4 is applied onto semiconductor substrate 1 and is patterned such that the end (E2) of photoresist film 4 is located inner than the end (E1) of semiconductor substrate 1. A portion outer than the end (E3) of adhesive 3 is covered by photoresist film 4. As a result, in a plane view, a ring-shaped area, wherein the end E1 of semiconductor substrate 1 is exposed, is formed, and areas other than the ring-shaped area are covered by photoresist film 4.

(FIG. 2)

Silicon-etching is performed by using photoresist film 4 as a mask so as to form gap $d_1$.

Dry etching using $SF_6$ gas can be used for the silicon-etching. After etching, photoresist film 4 is removed.

Gap $d_1$ after etching becomes larger than gap $d_0$ in the initial stage. Preferably, the size of $d_1$ is greater than 6 μm.

More practically, in consideration of nonuniformity of $d_0$ in the initial stage, it is possible to enlarge $d_1$ to at least 6 μm in the entire of the outer periphery of the substrate, for example, by setting a distance between E1 and E2 to be 6 μm.

Also, considering that a conductive film is formed by sputtering as a post-process, it is desirable to set a distance between E1 and E2 by increasing the thickness of the conductive film. Specifically, it is desirable to set a value obtained by subtracting twice of the final thickness of the conductive film from a distance between E1 and E2 to be 6 μm. A distance between E1 and E2 may be set to exceed 6 μm. However, the distance should be set not to overlap a chip area in the outer periphery of the semiconductor substrate.

In this exemplary embodiment, a gap between the semiconductor substrate and the adhesive is enlarged by etching the side of the semiconductor substrate, thereby avoiding discharge caused when forming a conductive film by sputtering.

When forming a TSV on the back surface of a semiconductor substrate, a through hole is formed so as to form a seed layer by sputtering and to bury a conductive film by electroplating. Methods known in the art, such as dry-etching described in the fifth embodiment below, wet-etching, laser ablation, etc., may be used as a method for forming a through hole. If a conductive pad, etc. contacting a TSV is already formed on the main surface S, a through hole is formed by use of a method not affecting the conductive pad. Also, in order for adjacent TSVs to be insulated, an insulating film is formed around the TSVs before forming a conductive film. For example, it is possible to use a method for forming a TSV, wherein a ring-shaped buried insulating film is formed on the main surface of a semiconductor substrate, and thereafter, a through hole is formed in the area of the semiconductor substrate surrounded by the buried insulating film, as disclosed in JP 2009-111061A.

JP 2007-311385A discloses that a TSV is formed on the main surface S of a semiconductor substrate, the TSV is exposed by grinding the back surface of the semiconductor substrate, and thereafter, a conductive film used for a conductive pad, bump electrode, etc. is formed. The method disclosed in JP 2007-311385A can be applied to the present invention.

As mentioned above, a TSV, a conductive pad, a bump electrode, etc. are formed, and thereafter, semiconductor substrate 1 is separated from support 2. There is a method for separating semiconductor substrate 1 from support 2 by eluting adhesive 3 by use of a soluble solvent or by heating adhesive 3 so as to reduce its adhesivity.

As one example, below is an explanation of a method for forming a TSV, comprising: forming a ring-shaped buried insulating film (referred to as a "insulating ring") on the main surface of a semiconductor substrate and forming a TSV in the semiconductor substrate area surrounded by the insulating ring. FIG. 15 shows one example of a semiconductor device (semiconductor chip, 50) comprising a TSV, to which the present invention is applied. FIG. 15A is a schematic sectional view of a TSV. FIGS. 15B and 15C are schematic plane views of the surface and back surface of semiconductor chip 50, respectively. FIG. 15A is a sectional view of A1-A1 in FIGS. 15B and 15C.

In semiconductor substrate 21, insulating ring 22 for insulating a TSV from a device area (DA) is provided and TSV plug 39 comprising seed layer 36 and Cu plug 38 is formed in the TSV formation area surrounded by insulating ring 22. In this example, plug 39 is integrally formed with an external terminal (bump). However, plug 39 and the external terminal may be formed separately. Solder film 40 (Sn—Ag plating layer) is formed on the surface of the bump in plug 39.

On the main surface where semiconductor element 23 is formed, wiring structure 25 comprising a conductor wiring and a plug is formed within inter-layer insulating film 24. Inter-layer insulating film 24 is made from silicon dioxide, etc. The lowest layer of wiring structure 25 is a pad electrode contacting plug 39 and is made from metals, for example, tungsten, etc. The upper wiring layer is made from a conductor, such as aluminum, etc. The uppermost film of wiring structure 25 is covered with a surface protection film (silicon nitride film 26a and passivation film 26b). An opening exposing the uppermost portion of wiring structure 25 is formed on the surface protection film 26, and bump electrode 31 is formed within the opening. Bump electrode 31 comprises seed layer 27, Cu layer 29, and Ni layer 30. Herein, TSV 41 includes from plug 39 on the back surface to bump electrode 31 on the surface.

FIG. 15 shows that in the center of semiconductor chip 50, a plurality of TSVs 41 is arranged in row. However, the present invention is not limited to have such arrangement.

Below is an explanation of a method for manufacturing semiconductor chip 50. FIGS. 16A to 16D are sectional views showing a method for manufacturing a semiconductor chip and correspond to FIG. 15.

From insulating ring 22 to bump electrode 31 are formed on the main surface of semiconductor substrate 21 (a semiconductor substrate, on which the insulating ring and the bump electrode are formed, is indicated by drawing reference numeral "1"). In order to grind the back surface, semiconductor substrate 1 is fixed to support 2 by use of adhesive 3 (see FIG. 16A).

Figure 16A:
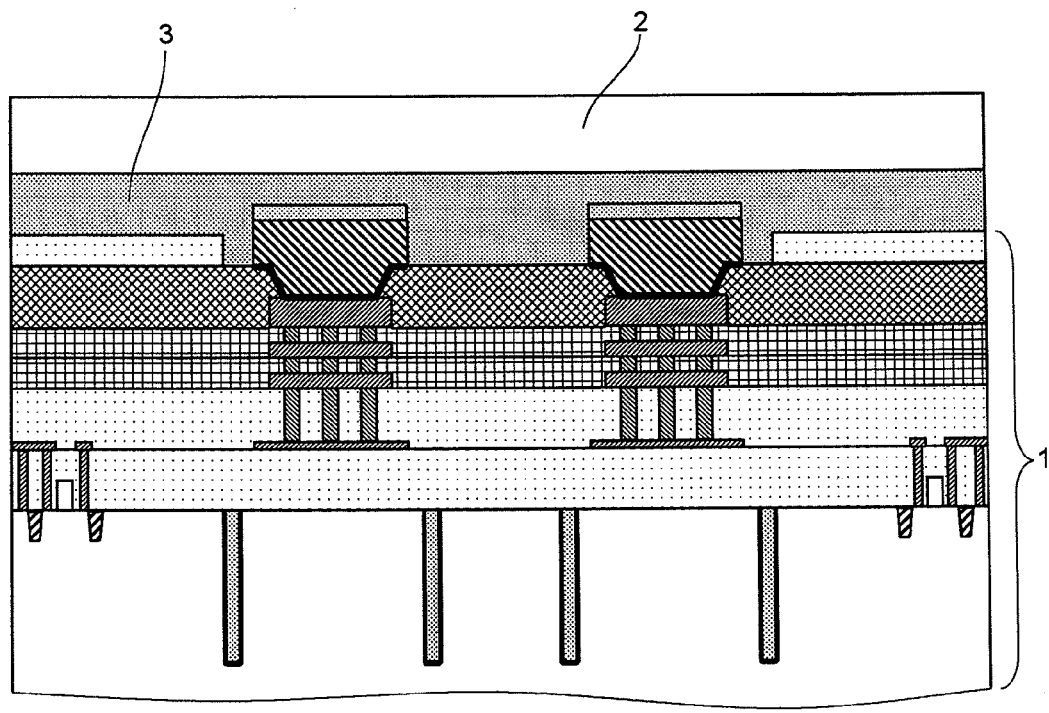
FIGS. 16A to 16D are sectional views explaining the process for manufacturing the semiconductor device shown in FIG. 15.
Figure 16B:
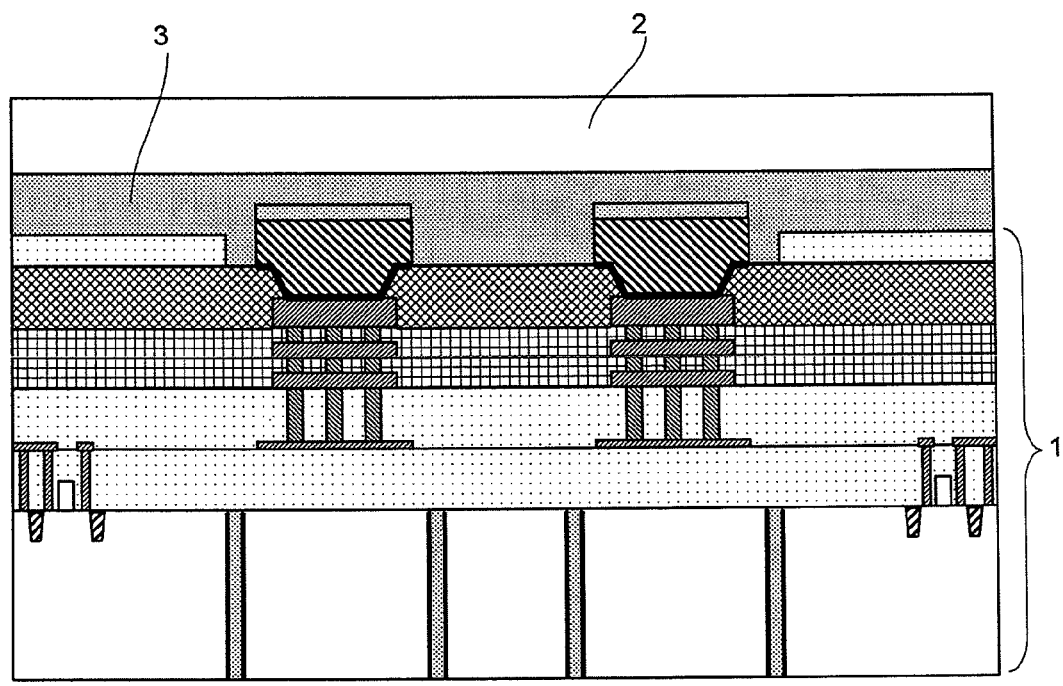
Figure 16C:
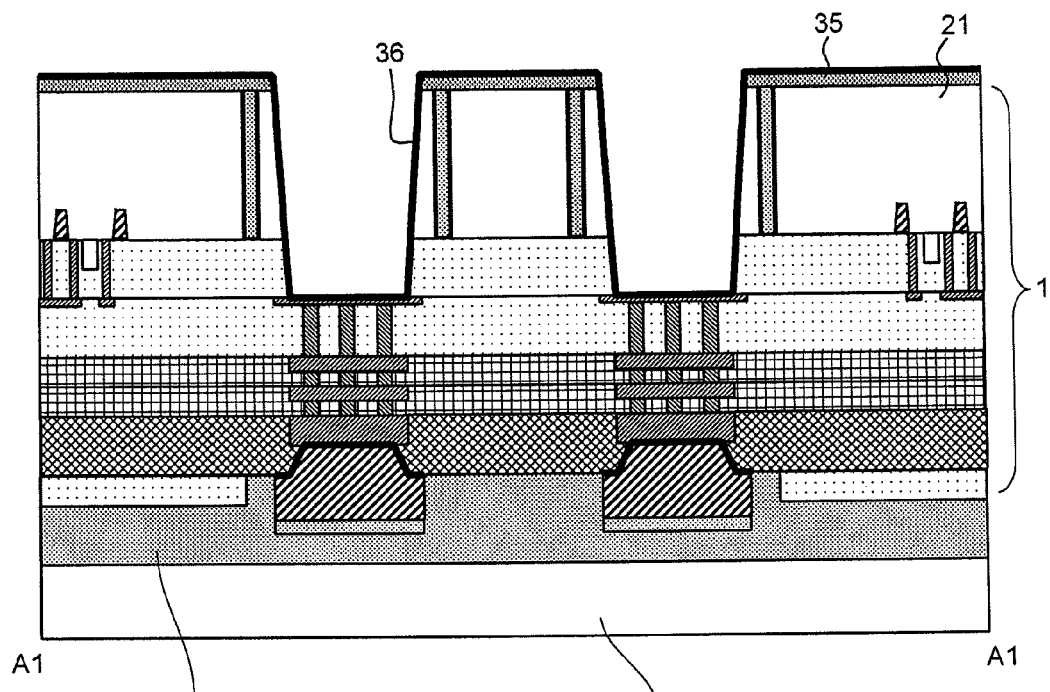
Figure 16D:
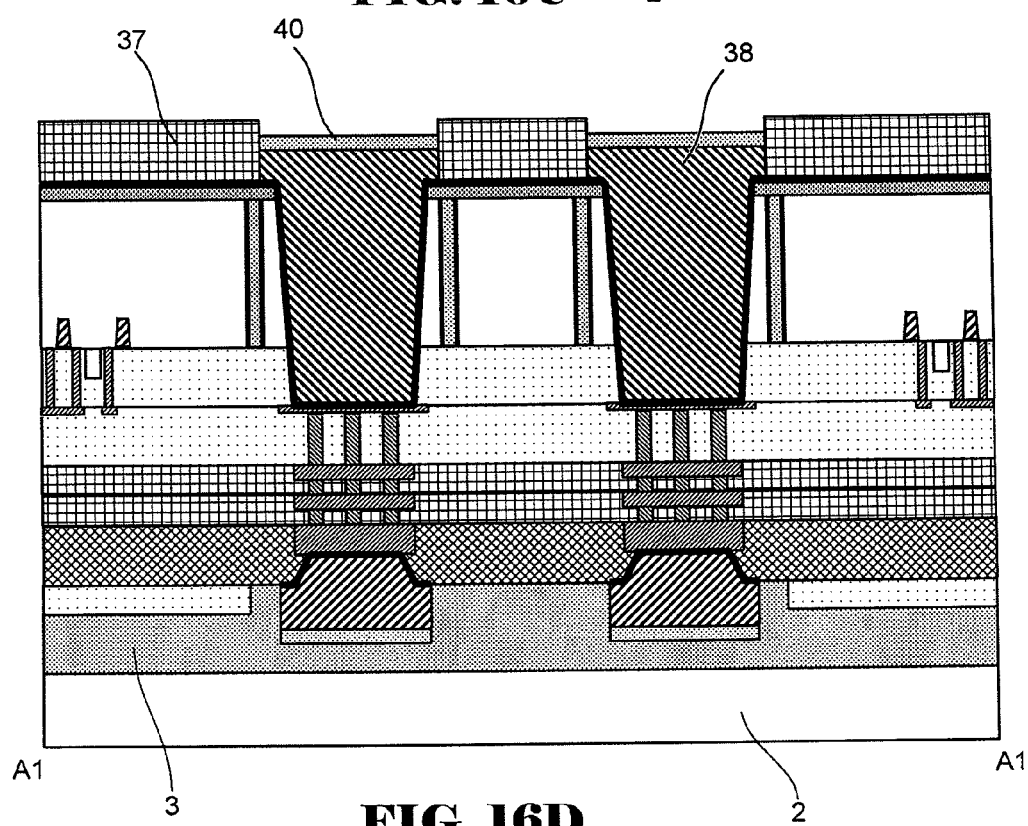

Subsequently, the back surface of semiconductor substrate 1 is ground until insulating ring 22 is exposed (see FIG. 16B).

Subsequently, back surface protection film 35 made from, for example, a silicon nitride film, is formed on the back surface while fixing semiconductor substrate 1 to support 2. An opening for the TSV is formed within the area surrounded by insulating ring 22 by photolithography and dry etching, wherein a tungsten pad in the lowset film of wiring structure 25 is an etching stopper. After forming the opening, metal seed layer (Cu/Ti) 36 is formed on the entire of the back surface by sputtering (see FIG. 16C).

Subsequently, photoresist film 37 for forming a TSV is formed on metal seed layer 36, and photoresist film 37 within or around the opening is removed. Photoresist film 37 around the opening may change based on the shape of the bump integrally formed with the TSV. Cu plug 38 is formed by electroplating, and subsequently, solder film 40 (Sn—Ag plating layer) is formed by electroplating (see FIG. 16D). Subsequently, photoresist film 37 and the exposed seed layer 36 are removed, and thereafter, semiconductor substrate 1 is separated from support 2.

Thereafter, semiconductor substrate 1 separated from support 2 is divided into chips by dicing, etc., thereby obtaining semiconductor chip 50 shown in FIG. 15. Each divided chip is assembled as a semiconductor device by stacking them bonding by TSVs.

Second Exemplary Embodiment

Figure 3:
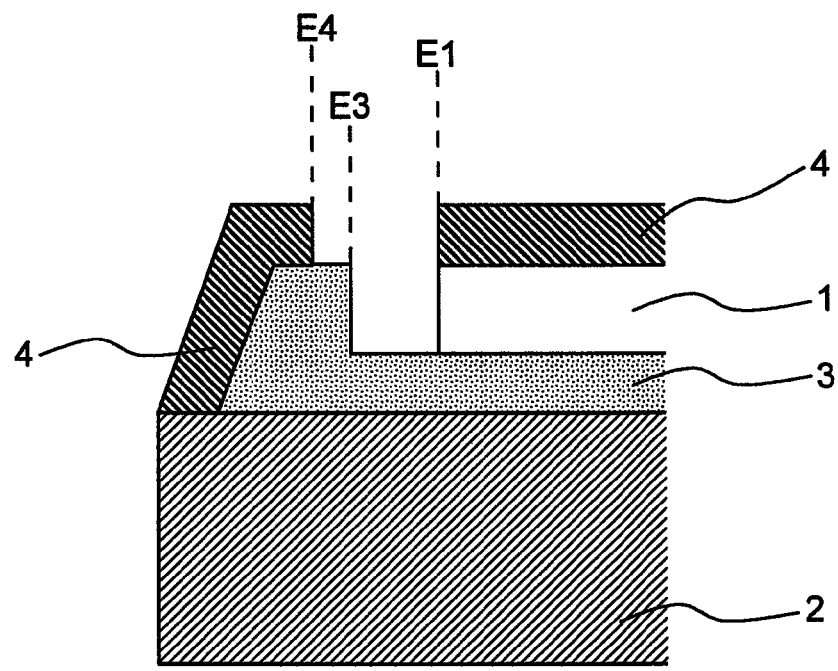
FIG. 3 is a mimetic sectional view of one end of a semiconductor substrate that explains the processes in the second embodiment.
Figure 4:
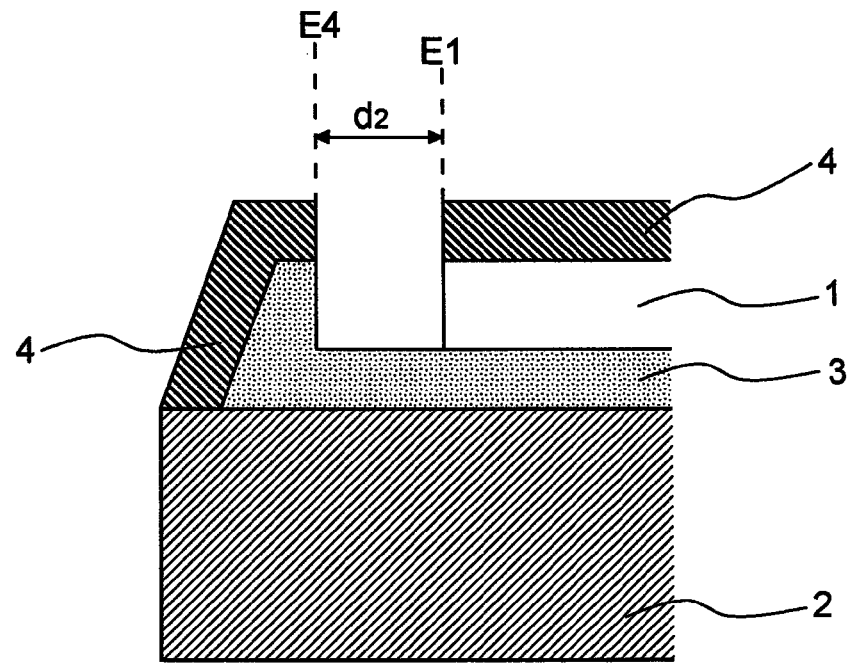
FIG. 4 is a mimetic sectional view of one end of a semiconductor substrate after performing the second embodiment.

Like in the related art, the second exemplary embodiment fixes a semiconductor substrate, such as silicon, etc. to a support and prepares the semiconductor substrate that is adjusted to have a predetermined thickness by back-grinding FIGS. 3 and 4 are mimetic sectional views of one end (portion indicated by broken lines in FIG. 10) of semiconductor substrate 1.

(FIG. 3)

Photoresist film 4 is applied onto semiconductor substrate 1 and is patterned such that the end (E4) of photoresist film 4 is located outer than the end (E3) of adhesive 3. A portion inner than the end (E1) of semiconductor substrate 1 is covered by photoresist film 4. As a result, in a plane view, a ring-shaped area, wherein the end E3 is exposed, is formed, and areas other than the ring-shaped area are covered by photoresist film 4.

(FIG. 4)

Adhesive 3 is etched using photoresist film 4 as a mask so as to form gap $d_2$. Dry etching using oxygen gas may be used for an adhesive-etching. Because adhesive 3 and photoresist film 4 are organic substances, photoresist film 4 is also etched. Photoresist film 4 may be entirely removed during etching depending on etching conditions and the thickness of photoresist film 4. In this case, there is no problem, because etching cannot be performed when the silicon surface of semiconductor substrate 1 is exposed. If photoresist film 4 remains after etching, it is removed.

In this embodiment, after etching, gap $d_2$ is larger than gap $d_0$ in the initial stage. Preferably, the size of $d_2$ is at least than 6 μm.

In this embodiment, regardless of nonuniformity of $d_0$ in the initial stage, it is desirable to set a distance between E1 and E4 on adhesive 3 in the outer periphery to be 6 μm.

Also, as explained in the first exemplary embodiment, considering that a conductive film is formed as a post-process, it is desirable to set a value obtained by subtracting twice of the final thickness of the conductive film from a distance between E1 and E4 to be at least 6 μm.

In this embodiment, a gap between the semiconductor substrate and the adhesive is enlarged by etching the side of the adhesive, thereby avoiding discharge.

Third Exemplary Embodiment

Figure 5:
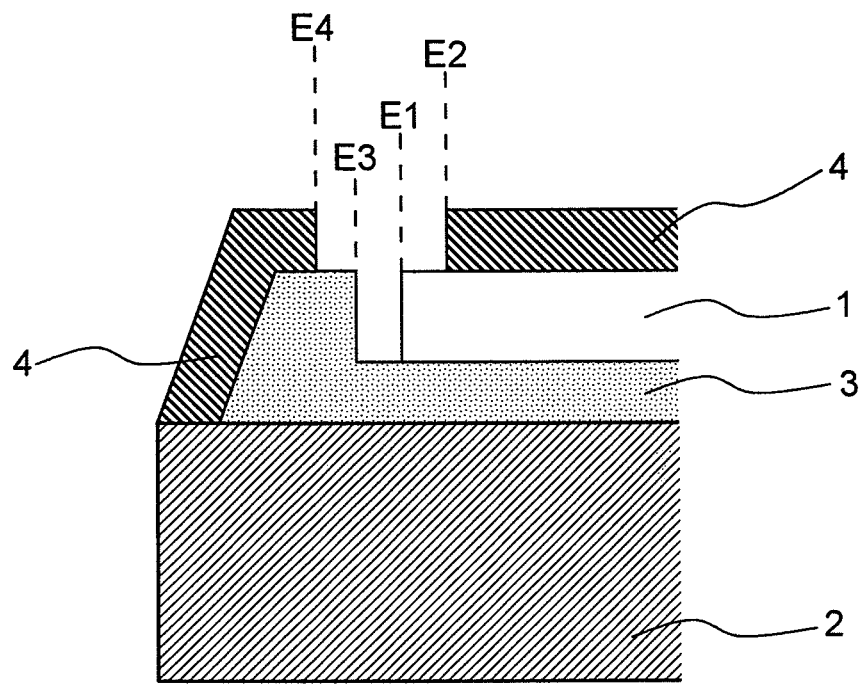
FIG. 5 is a mimetic sectional view of one end of a semiconductor substrate that explains the processes in the third embodiment.
Figure 6:
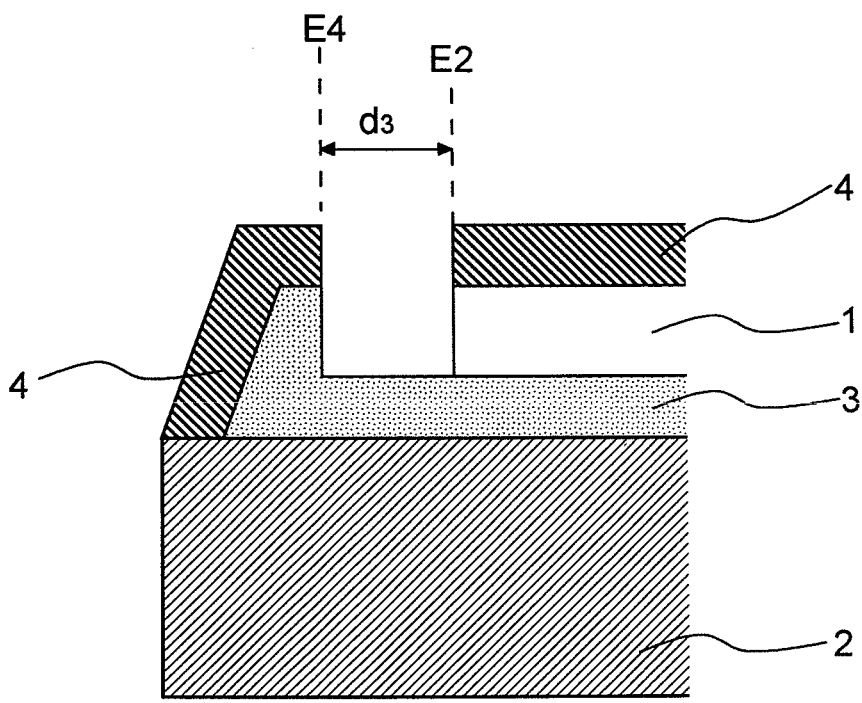
FIG. 6 is a mimetic sectional view of one end of a semiconductor substrate after performing the third embodiment.

Like in the related art, the third embodiment fixes a semiconductor substrate, such as silicon, etc., to a support and prepares the semiconductor substrate that is adjusted to have a predetermined thickness by back-grinding FIGS. 5 and 6 are mimetic sectional views of one end (portion indicated by broken lines in FIG. 10) of semiconductor substrate 1.

(FIG. 5)

Photoresist film 4 is applied onto semiconductor substrate 1 and is patterned such that the end (E4) of photoresist film 4 is located outer than the end (E3) of adhesive 3 and the end (E2) of photoresist film 4 is located inner than the end (E1) of semiconductor substrate 1. As a result, in a plane view, a ring-shaped area, wherein the ends E1 and E3 are exposed, is formed, and an area other than the ring-shaped area is covered by photoresist film 4.

(FIG. 6)

After silicon-etching is carried out by using photoresist film 4 as a mask, adhesive 3 is etched so as to form gap $d_3$. If photoresist film 4 remains after etching, it is removed.

After etching, gap $d_3$ is larger than gap $d_0$ in the initial stage. Preferably, the size of $d_3$ is at least 6 μm. In this embodiment, regardless of a difference in gap size in the initial stage, it is desirable to set a distance between E2 and E4 on adhesive 3 in the outer periphery to be at least 6 μm.

It is desirable to set a distance between E2 and E4 in consideration of a thickness of a conductive film that is formed as a post-process. Specifically, it is desirable to set a value obtained by subtracting twice of the final thickness of the conductive film from a distance between E2 and E4 to be at least 6 μm.

In this embodiment, a gap between the semiconductor substrate and the adhesive is enlarged by etching both the side of the semiconductor substrate and the side of the adhesive, thereby avoiding discharge.

Fourth Exemplary Embodiment

Figure 7:
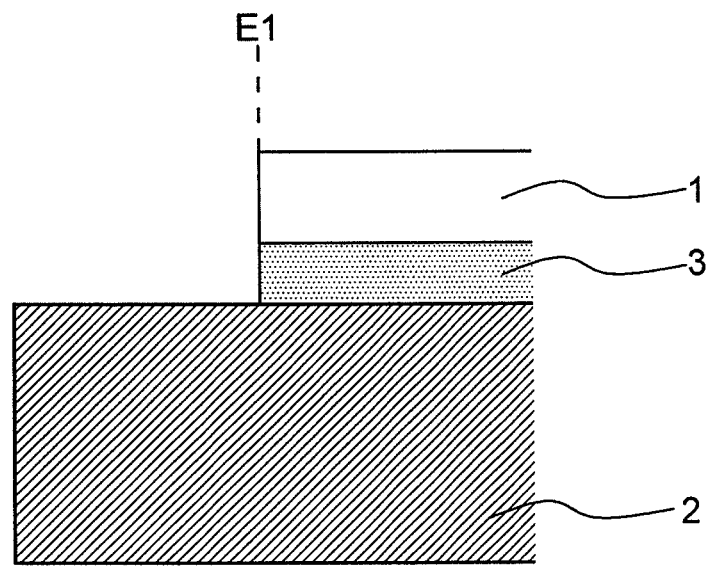
FIG. 7 is a mimetic sectional view of one end of a semiconductor substrate after performing the fourth embodiment.
Figure 10:
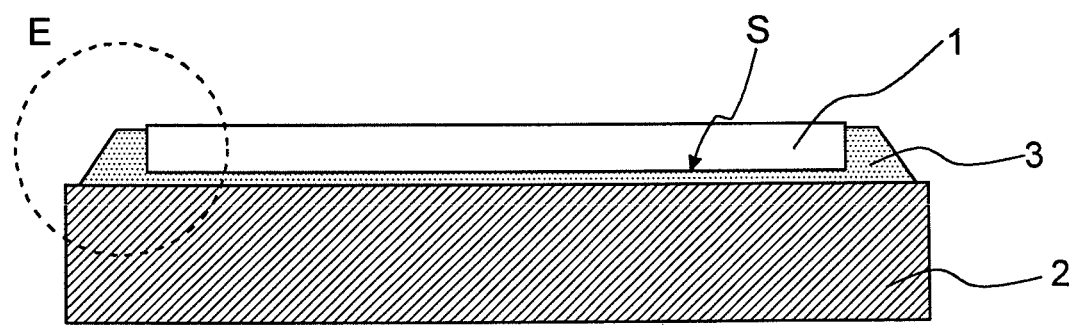
FIG. 10 explains a problem of the related art and is a mimetic sectional view of a semiconductor substrate (wafer) to which a support is fixed.
Figure 11:
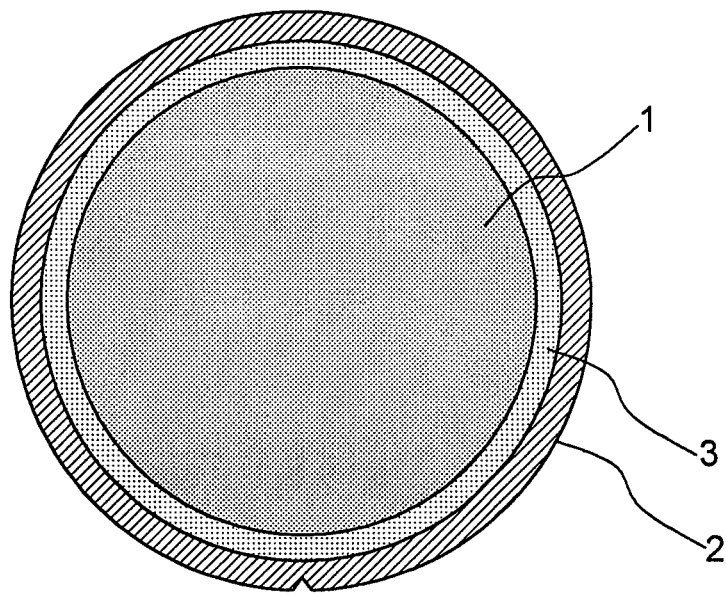
FIG. 11 is a top view of FIG. 10.

Like in the related art, the fourth exemplary embodiment fixes a semiconductor substrate, such as silicon, etc., to a support and prepares the semiconductor substrate that is adjusted to have a predetermined thickness by back-grinding FIG. 7 is a mimetic sectional view of one end of semiconductor substrate 1 (portion indicated by broken lines in FIG. 10).

(FIG. 7)

Figure 12:
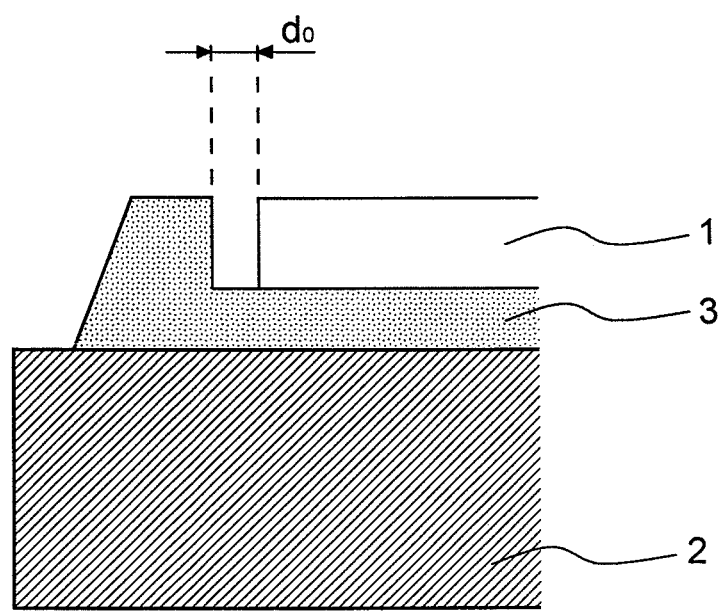
FIG. 12 is an enlarged mimetic sectional view of the portion E indicated by broken lines in FIG. 10.
Figure 13:
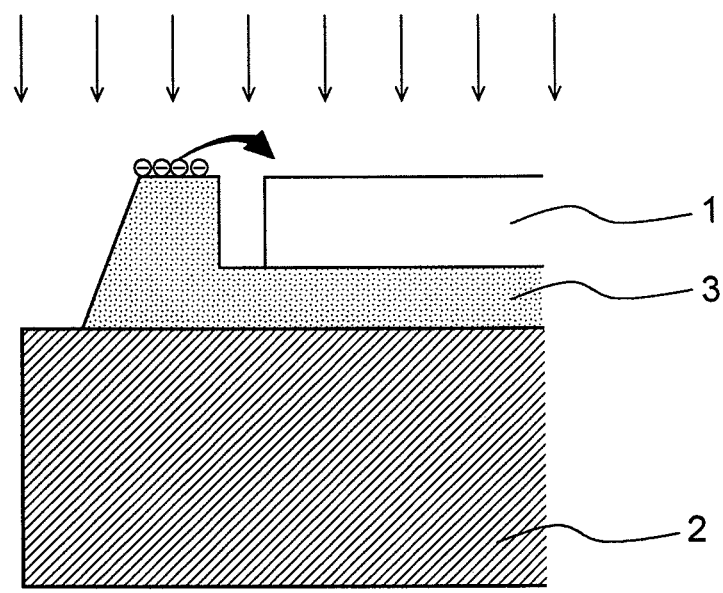
FIG. 13 illustrates discharge.

In this embodiment, a photoresist layer is not provided and adhesive-etching is performed as in the related art, as shown in FIG. 12. Adhesive-etching may be wet etching using a solvent, as well as dry etching using oxygen gas. Wet etching uses a single wafer etching apparatus and applies liquid chemical (solvent) only onto the outer peripheral end of support 2.

Because semiconductor substrate 1 is masked, an adhesive in a portion, which is sandwiched between semiconductor substrate 1 and support 2, remains. Therefore, semiconductor substrate 1 is maintained to be fixed to support 2.

In this embodiment, as shown in FIG. 7, the adhesive provided outer than the end E1 of semiconductor substrate 1 is entirely removed. Therefore, it is possible to avoid discharge.

Fifth Exemplary Embodiment

Like in the related art, the fifth exemplary embodiment fixes a semiconductor substrate, such as silicon, etc., to a support and prepares the semiconductor substrate that is adjusted to have a predetermined thickness by back-grinding When forming a TSV, a contact hole for disposing the TSV is formed on the back surface (upper surface in FIG. 10) of the semiconductor substrate by etching so as to penetrate a silicon layer in the semiconductor substrate by etching, and thereafter, a conductive film is filled in the contact hole. Specifically, a conductive seed layer is formed by sputtering, and thereafter, a conductor is filled by electroplating, etc. Before forming the conductive seed layer, an insulating film for insulating adjacent TSVs is provided to surround the TSVs.

Figure 8:
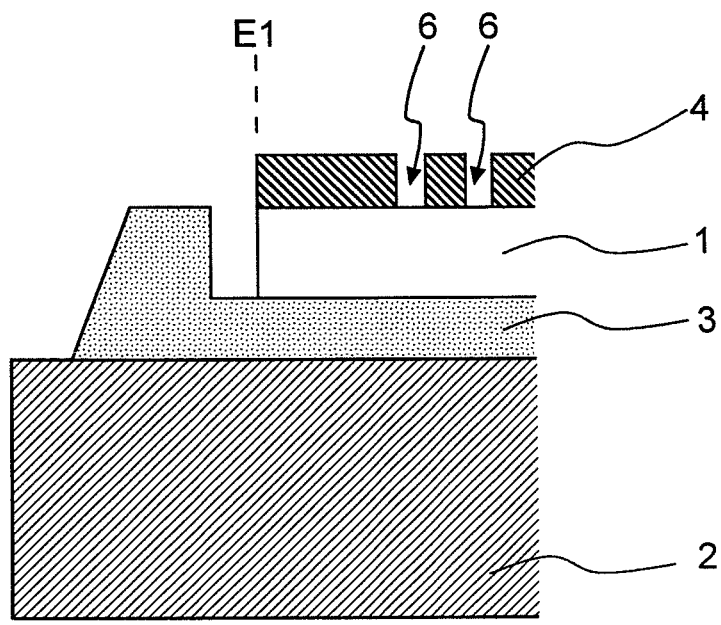
FIG. 8 is a mimetic sectional view of one end of a semiconductor substrate that explains the processes in the fifth embodiment.

FIG. 8 is a mimetic sectional view of one end (portion indicated by broken lines in FIG. 10) of semiconductor substrate 1. In FIG. 8, photoresist film 4 having opening pattern 6 of a contact hole for a TSV is formed. Photoresist film 4 is formed to cover only inside the end (E1) of semiconductor substrate 1, wherein the silicon layer is dry-etched to form the contact hole on the portion where opening pattern 6 is formed.

Figure 9:
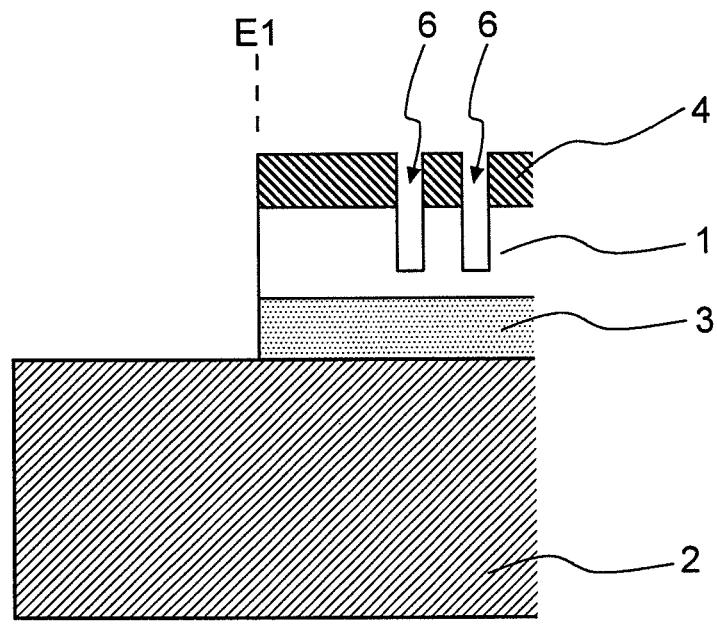
FIG. 9 is a mimetic sectional view of one end of a semiconductor substrate after performing the fifth embodiment.

Subsequently, as shown in FIG. 9, an adhesive is dry-etched by use of oxygen gas, etc. while not removing photoresist film 4

Photoresist film 4 may be entirely removed during the etching of the adhesive depending on etching conditions and the thickness of photoresist film 4. In this case, there is no problem, because etching cannot be performed when the silicon surface of semiconductor substrate 1 is exposed.

As a result, adhesive 3 applied outer than the end E1 is removed, so that the end of the semiconductor substrate is prepared as shown in FIG. 7. If photoresist film 4 remains after etching, it is removed.

The method explained in this embodiment can be performed in combination with the first to third embodiments. In other words, when forming opening pattern 6 in photoresist film 4, the end of semiconductor substrate 1 may be exposed as explained in any one of the first to third embodiments.

Silicon-etching explained in the first to third exemplary embodiments can be performed concurrently with silicon dry-etching of opening pattern 6.

After silicon dry-etching of opening pattern 6, the adhesive-etching explained in the second and third exemplary embodiments can be continuously performed without removing photoresist film 4.

Accordingly, it is possible to reduce manufacturing processes by processing the outer periphery of the semiconductor substrate concurrently with forming the contact hole for the TSV.

What is claimed is:

1. A method for manufacturing a semiconductor device comprising:
    fixing a semiconductor substrate to a support having an external diameter greater than that of the semiconductor substrate by use of an adhesive; and
    forming a conductive film on the semiconductor substrate by a method comprising at least sputtering after fixing the semiconductor substrate to the support;
    wherein before forming the conductive film, a gap between the semiconductor substrate and the adhesive flown out from the outer periphery of the semiconductor substrate is enlarged to a predetermined size by removing at least one of the semiconductor substrate and the adhesive.

2. A method according to claim 1, the gap is enlarged by removing a part of the semiconductor layer in the outer periphery of the semiconductor substrate.

3. A method according to claim 1, the gap is enlarged by removing at least a part of the adhesive flown out from the outer periphery of the semiconductor substrate.

4. A method according to claim 3, the adhesive flown out from the outer periphery of the semiconductor substrate is entirely removed.

5. A method for manufacturing a semiconductor device, comprising:
    fixing a semiconductor substrate to a support on a main surface of the semiconductor substrate by use of an adhesive, a main surface of the semiconductor substrate comprising a circuit layer having a plurality of semiconductor elements, the support having an external diameter greater than that of the semiconductor substrate;
    reducing the thickness of the semiconductor substrate by grinding the back surface of the semiconductor substrate;
    forming a conductive film on the back surface of the semiconductor substrate by a method comprising at least sputtering, after fixing the semiconductor substrate to the support; and
    separating the semiconductor substrate, on the back surface of which the conductive film is formed, from the adhesive and the support,
    wherein after reducing the thickness of the semiconductor substrate and before forming the conductive film, a gap between the semiconductor substrate and the adhesive flown out from the outer periphery of the semiconductor substrate is enlarged to a predetermined size.

6. A method according to claim 5, the gap is enlarged by removing a part of the semiconductor layer in the outer periphery of the semiconductor substrate.

7. A method according to claim 5, the gap is enlarged by removing at least a part of the adhesive flown out from the outer periphery of the semiconductor substrate.

8. A method according to claim 7, the adhesive flown out from the outer periphery of the semiconductor substrate is entirely removed.

9. A method according to claim 5, the gap is enlarged by removing a part of the semiconductor layer in the outer periphery of the semiconductor substrate and a part of the adhesive flown out from the outer periphery of the semiconductor substrate.

10. A method according to claim 5, the enlarged gap is at least 6 µm.

11. A method according to claim 10, the gap has a size obtained by subtracting twice of the thickness of the conductive film formed by sputtering.

12. A method according to claim 5, forming a conductive film comprises forming a seed layer by sputtering; and forming an electroplating film by using the seed layer as a core.

13. A method for manufacturing a semiconductor device, the semiconductor device comprising a circuit layer having a plurality of semiconductor elements on the main surface of a semiconductor substrate and a through-substrate via (TSV) penetrating between the main surface and the back surface facing the main surface, the method comprising:
fixing the semiconductor substrate, on which the circuit layer is formed, to a support having an external diameter greater than that of the substrate on the main surface by use of an adhesive;
reducing the thickness of the semiconductor substrate by grinding the back surface of the semiconductor substrate;
forming a through hole penetrating the semiconductor substrate from the back surface to the main surface;
forming a TSV by filling a conductive film in the through hole; and
separating the semiconductor substrate, on which the conductive film is formed, the adhesive, and the support,
wherein forming the TSV comprises forming a seed layer covering the interior of the through hole by sputtering, and thereafter forming a conductive film in the through hole by electroplating the seed layer as an electrode; and
wherein after reducing the thickness of the semiconductor substrate and before forming the seed layer, a gap between the semiconductor substrate and the adhesive flown out from the outer periphery of the semiconductor substrate is enlarged to a predetermined size.

14. A method according to claim 13, the gap is enlarged by removing a part of the semiconductor layer in the outer periphery of the semiconductor substrate.

15. A method according to claim 13, the gap is enlarged by removing a part of the semiconductor layer in the outer periphery of the semiconductor substrate and a part of the adhesive flown out from the outer periphery of the semiconductor substrate.

16. A method according to claim 14, a part of the semiconductor layer in the outer periphery of the semiconductor substrate is removed concurrently with forming the through hole.

17. A method according to claim 13, the gap is enlarged by removing at least a part of the adhesive flown out from the outer periphery of the semiconductor substrate.

18. A method according to claim 17, the adhesive flown out from the outer periphery of the semiconductor substrate is entirely removed.

19. A method according to claim 13, the enlarged gap is at least 6 μm.

20. A method according to claim 19, the gap has a size obtained by subtracting twice of the thickness of the seed layer made by sputtering.

* * * * *